(12) United States Patent
Davis et al.

(10) Patent No.: US 6,377,445 B1
(45) Date of Patent: Apr. 23, 2002

(54) MOTHERBOARD MOUNTING ASSEMBLY

(75) Inventors: David R. Davis, Jefferson, SD (US); David D. Williams; Daniel C. Castillo, both of El Paso, TX (US); Salah Din, Dakota Dunes, SD (US); Paul O. Amdahl; Dirk O. Cosner, both of Sioux City, IA (US)

(73) Assignee: Gateway, Inc., N. Sioux City, SD (US)

( * ) Notice: Subject to any disclaimer, the term of this patent is extended or adjusted under 35 U.S.C. 154(b) by 35 days.

(21) Appl. No.: 09/639,686

(22) Filed: Aug. 14, 2000

(51) Int. Cl.$^7$ ................................................. H05K 1/11
(52) U.S. Cl. ........................ 361/683; 361/801; 361/804; 361/760; 174/52.1; 174/138 D; 174/138 G; 411/32; 24/573.2
(58) Field of Search .................... 361/740, 742, 361/744, 752–754, 756, 759, 758, 760, 787, 799, 784, 801–804, 790, 770; 174/138 E, 138 D, 138 G, 138 R, 156, 157, 52.1, 158 R, 166 R, 166 S; 411/32, 45, 57, 34, 55, 40, 166, 965, 508, 550, 549, 553; 24/297, 453, 458, 563, 573.2; 211/41.17; 248/221.12, 222.61, 500; 29/832; 439/65, 74, 93, 95, 75, 92, 567, 571; 403/408.1, 168, 258, 21; 250/338.1, 352

(56) References Cited

U.S. PATENT DOCUMENTS

| | | | |
|---|---|---|---|
| 3,279,518 A | * 10/1966 | Bollinger | 151/41.7 |
| 4,007,516 A | * 2/1977 | Couyles | 24/221 R |
| 4,502,193 A | * 3/1985 | Harmon et al. | 174/138 D |
| 4,760,495 A | * 7/1988 | Till | 361/412 |
| 4,786,225 A | * 11/1988 | Poe et al. | 411/32 |
| 5,223,674 A | * 6/1993 | Reznikov | 174/138 D |
| 5,345,366 A | * 9/1994 | Cheng et al. | 361/785 |
| 5,434,746 A | 7/1995 | Testa et al. | 361/752 |
| 5,452,184 A | 9/1995 | Scholder et al. | 361/799 |
| 5,490,038 A | 2/1996 | Scholder et al. | 361/759 |
| 5,707,244 A | 1/1998 | Austin | 439/95 |
| 5,748,442 A | 5/1998 | Toor | 361/685 |
| 5,754,412 A | * 5/1998 | Clavin | 361/804 |
| 5,796,593 A | 8/1998 | Mills et al. | 361/801 |
| 5,838,538 A | 11/1998 | Yee | 361/683 |
| 5,953,217 A | 9/1999 | Klein et al. | 361/759 |
| 5,963,432 A | * 10/1999 | Crowley | 361/804 |
| 5,973,926 A | 10/1999 | Sacherman et al. | 361/759 |
| 5,978,232 A | 11/1999 | Jo | 361/796 |
| 6,017,226 A | 1/2000 | Jeffries et al. | 439/92 |
| 6,035,514 A | 3/2000 | Dean | 29/453 |
| 6,040,980 A | 3/2000 | Johnson | 361/685 |
| 6,114,626 A | * 9/2000 | Barnes et al. | 174/52.1 |
| 6,124,552 A | * 9/2000 | Boe | 174/135 |
| 6,140,591 A | * 10/2000 | Osborne et al. | 174/138 E |
| 6,233,156 B1 | * 5/2001 | Liao | 361/759 |

FOREIGN PATENT DOCUMENTS

JP       404224310 A  *  8/1992  ........... F16B/19/00

OTHER PUBLICATIONS

Article: "Three Level Fastener" (IBM Technical Disclosure Bulletin, Nov. 1975, vol.No. 18, Issue No. 6, page No. 1735).*

* cited by examiner

Primary Examiner—Leo P. Picard
Assistant Examiner—Michael Datskovsky
(74) Attorney, Agent, or Firm—Kenneth J. Cool; Kevin E. West; Suiter & Associates, PC (57) ABSTRACT

Apparatus for mounting a circuit board within the chassis of an electronic device are disclosed. The chassis of an electronic device includes a mounting panel assembly having at least one slot for receiving a standoff mounted to the circuit board. Each slot includes a first end suitable for allowing insertion and removal of the standoff through the slot and a second end suitable for engaging the standoff to retain the standoff in the slot for securing the circuit board to the mounting panel assembly. A ramp member extends beneath the slot adjacent to the first end for urging the standoff toward the second end when the standoff is inserted in the slot through the first end.

26 Claims, 5 Drawing Sheets

MOTHERBOARD MOUNTING ASSEMBLY

FIELD OF THE INVENTION

The present invention generally relates to electronic devices such as personal computer systems, servers, photocopiers, facsimile machines, printers and the like which utilize circuit boards for containing the electronic components of the device, and in particular electronic devices such as computer systems utilizing a primary circuit board or motherboard for containing the primary electronic components of the device. More specifically, the present invention relates to apparatus for mounting such a circuit board within the case or chassis of the electronic device.

BACKGROUND OF THE INVENTION

Electronic devices, particularly computer systems, servers, photocopiers, facsimile machines, printers and the like often include one or more circuit boards, often refereed to as a motherboard which contains many of the principal electronic components of the device. This motherboard may also contain sockets that accept additional boards or cards that provide functions to the electronic device. For instance, in a personal computer, the motherboard contains the bus, central processing unit (CPU) and coprocessor sockets, expansion card slots, memory sockets, keyboard controller and supporting chips. Chips that control the video display, serial and parallel ports, mouse and disk drives may also be present on the motherboard. If not, they are independent controllers that are plugged into an expansion slot on the motherboard.

Typically, the motherboard is mounted to the chassis of the electronic device via a plurality of screws extending through holes in the board into the chassis. For example, ATX and microATX form-factor motherboards require anywhere from six to ten screws to properly mount the motherboard in computer system chassis, while motherboards having AT or Baby AT form factors typically require ten fasteners. See, *ATX Specification,* Version 2.03, Intel Corp., December 1998; and *microATX Motherboard Interface Specification,* Version 1.0, Intel Corp., December 1997. However, the use of several fasteners to mount the motherboard makes assembly of the computer system more expensive and time consuming during manufacturing. Further, use of several fasteners makes the motherboard more difficult and time consuming to service, requires the use of a tool such as a screwdriver, wrench, or the like.

Consequently, it would be advantageous to provide an electronic device having a chassis or case including apparatus for securely mounting a circuit board within the chassis of an electronic device while allowing quick removal and installation of the circuit board without the use of tools such as a screwdriver, wrench, or the like.

SUMMARY OF THE INVENTION

Accordingly, the present invention is directed to apparatus for mounting a circuit board within the chassis of an electronic device. In an exemplary embodiment, the chassis of an electronic device includes a mounting panel assembly having at least one slot for receiving a standoff mounted to the circuit board. Each slot includes a first end suitable for allowing insertion and removal of the standoff through the slot and a second end suitable for engaging the standoff to retain the standoff in the slot for securing the circuit board to the mounting panel assembly. A ramp member extends beneath the slot adjacent to the first end for urging the standoff toward the second end when the standoff is inserted in the slot through the first end.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which is illustrated in the accompanying drawings.

Referring generally to FIGS. 1 through 8, a computer system employing a motherboard mounting assembly in accordance with an exemplary embodiment of the present invention is described. The computer system 100 includes a chassis 102 having at least one mounting panel assembly 104 suitable for mounting and supporting the computer system's motherboard 106 or like printed circuit board contained within the chassis 102. The mounting panel assembly 104 includes a plurality of apertures or slots 108 formed therein for receiving standoffs 110 mounted to the motherboard 106. Each slot 108 includes a first end 112 suitable for allowing insertion and removal of the standoff 110 through the slot 108 and a second end 114 suitable for engaging the standoff 110 to retain the standoff 110 in the slot 108 for securing the motherboard 106 to the mounting panel assembly 104. A ramp member 116 extends beneath the slot 108 adjacent to the first end 112 for urging the standoff 110 toward the second end 114 when the standoff 10 is inserted in the slot 108 through the first end 110. The present invention thus increases the efficiency in which motherboards or like printed circuit boards may be installed in and removed from computer systems or similar electronic devices by greatly reducing the number of fasteners that must be removed from the motherboard, e.g., from typically nine or ten screws requiring tools such as a screwdriver or wrench for their removal to a single thumbscrew fastener or like holding device. This reduction results in faster assembly of the computer system during manufacture, greater ease of service by the consumer, and less time spent by customer service personnel in providing guidance for removal of the motherboard, often via telephone, Internet chat room In FIG. 1, the mounting panel assembly 104 is shown as being comprised of a single panel having a generally continuous, flat surface on which a conventional flat motherboard 106 may be mounted. However, it is contemplated that instead of a single panel, mounting panel assemblies 104 in accordance with the present invention may be comprised of a plurality of panels each suitable for positioning one or more slots 108 to receive standoffs 110 mounted to the motherboard 106. Further, mounting panel assemblies 104 of the present invention should not be viewed as being limited to the generally flattened configuration shown in FIG. 1, but instead may have any shape suitable for positioning slots 108 to receive standoffs mounted to the motherboard 106 or like printed circuit board as contemplated by one of ordinary skill in the art.

Figure 1:
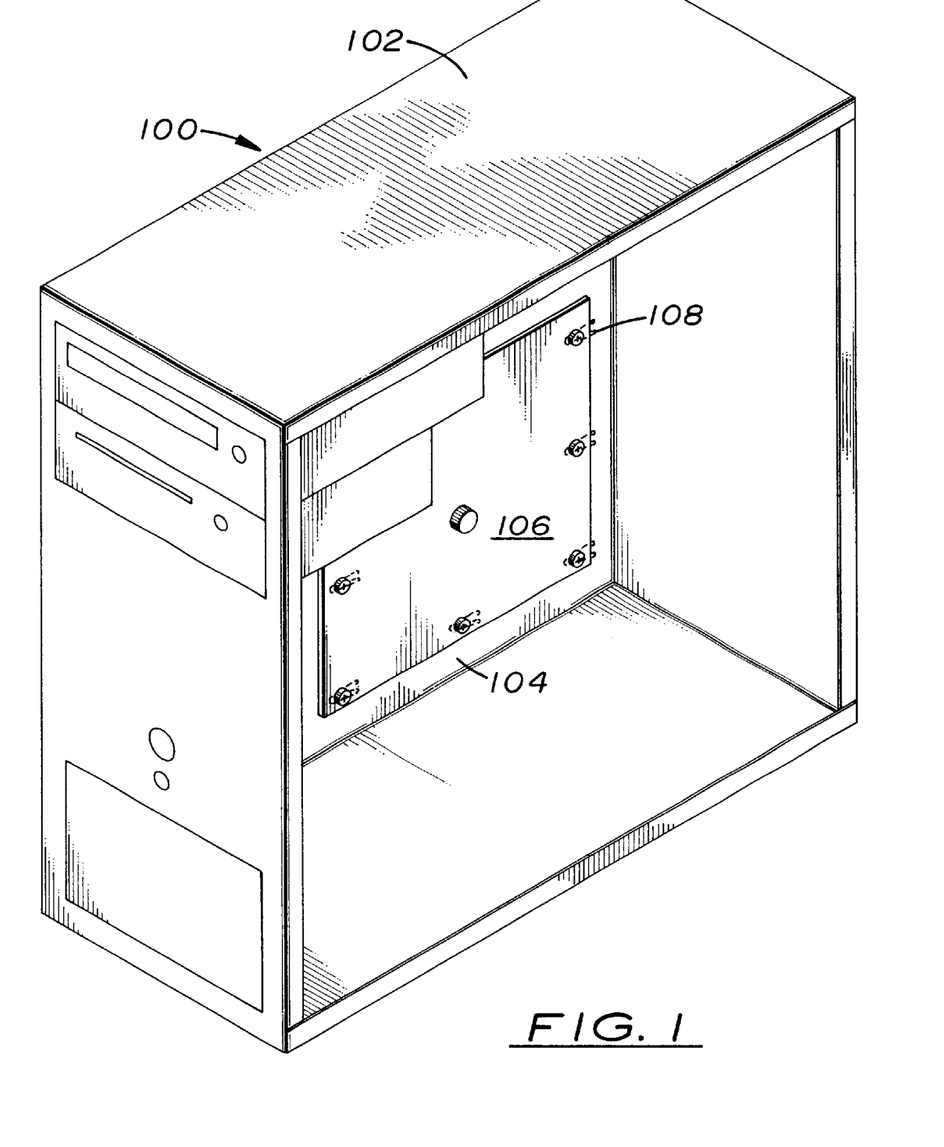
FIG. 1 is an isometric view illustrating the chassis of a computer system including apparatus for mounting the system's motherboard within the chassis in accordance with an exemplary embodiment of the present invention.
Figure 2:
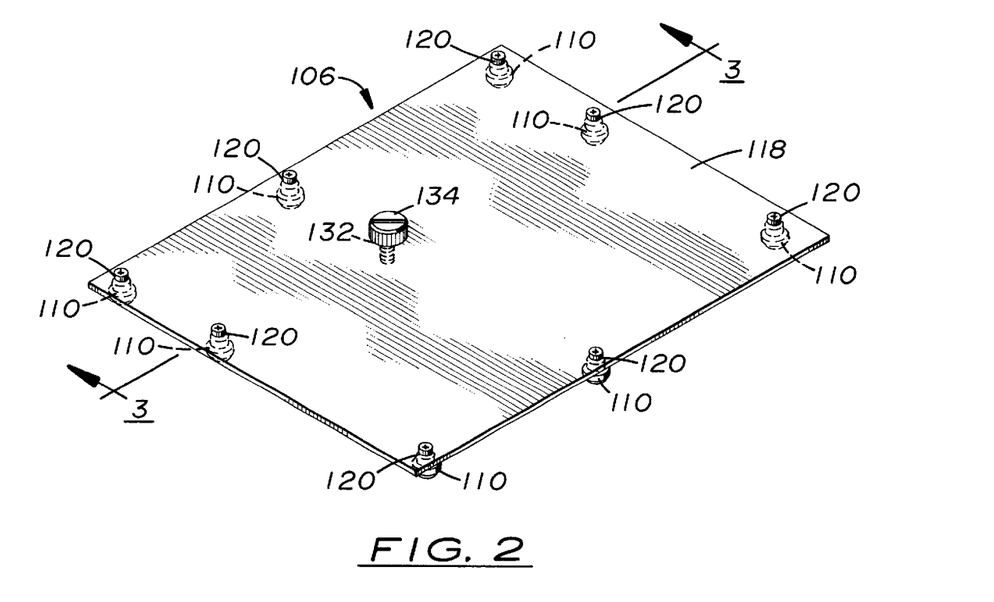
FIG. 2 is an isometric view illustrating the motherboard shown in FIG. 1.
Figure 3:
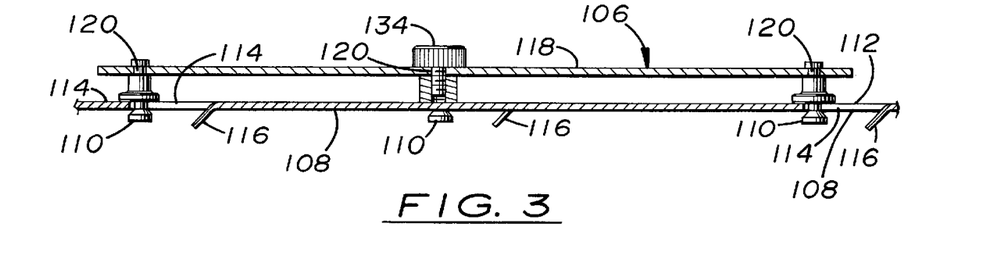
FIG. 3 is a cross-sectional view illustrating mounting of the circuit board to a mounting panel assembly within the chassis.

Referring now to FIGS. 2 and 3, the motherboard of the computer system shown in FIG. 1 is described. In an exemplary embodiment, the motherboard 106 is comprised of a printed circuit board 118 that contains many of the principal electronic components of the computer system 100. The motherboard 106 may also contain sockets that accept additional boards or cards, e.g., expansion cards, which provide functions to the computer system 100. For instance, in exemplary embodiments, the motherboard 106 may contain components such as the computer system's bus, central processing unit (CPU), expansion card slots, memory sockets, keyboard controller and supporting chips, chips that control the video display, serial and parallel ports, mouse and disk drives, and the like (not shown). Typically, the printed circuit board 118 is provided with a plurality of holes 120, 132 through which fasteners such as screws or the conventionally extend to secure the motherboard 106 within the chassis 102. For example, the motherboard 106 shown in FIG. 2 is depicted as having an ATX form-factor in accordance with the *ATX Specification,* Version 2.03 published by Intel Corporation, copyright 1998 which is herein incorporated by reference in its entirety. ATX form-factor motherboards typically have nine mounting holes requiring at least nine fasteners or screws to mount the motherboard in computer system chassis. However, it will be appreciated that the motherboard may employ other form factors having a different number of mounting holes requiring a different number of fasteners. For example, an exemplary motherboard may have a mini-ATX form factor as described in the ATX Specification, discussed supra, or a microATX or flexATX form factor in accordance with the *microATX Motherboard Interface Specification,* Version 1.0 published by Intel Corporation, copyright 1997 and *FlexATX Addendum Version 1.0 to the microATX Specification Version 1.0,* published by Intel Corporation, copyright 1999 which are herein incorporated by reference in their entirety. Alternately, an exemplary motherboard may have an AT or Baby AT form factor. Such motherboards typically have up to ten mounting holes requiring a corresponding number of fasteners to mount the motherboard in computer system chassis.

In accordance with an exemplary embodiment of the present invention, a plurality of standoffs are mounted to the bottom surface of the motherboard via the motherboard's mounting holes. For example, as shown in FIGS. 2 and 3, wherein an ATX form factor motherboard is illustrated, standoffs 110 may be mounted to holes 120 of the motherboard 106. A suitable fastener 134 such as a thumbscrew or the like is threaded though hole 132 into a hole formed in mounting panel assembly 104 for securing the motherboard 106 within the chassis 102.

Figure 4:
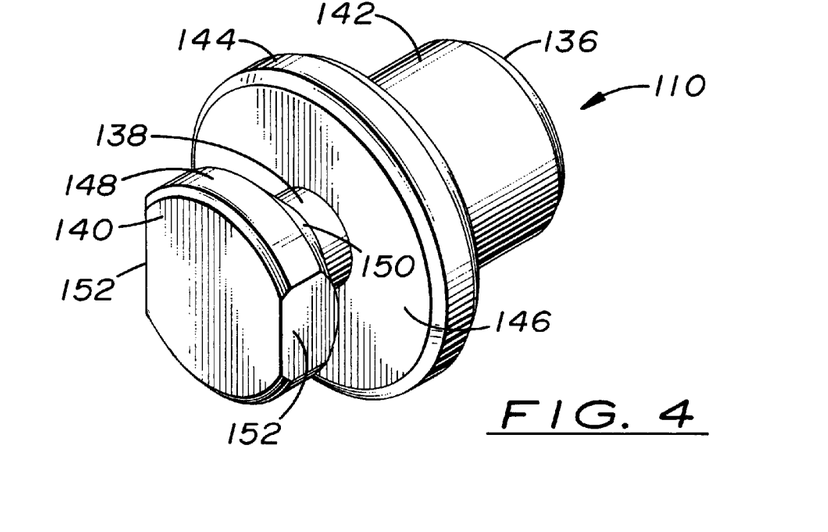
FIG. 4 is an isometric view illustrating an exemplary standoff suitable for mounting the motherboard shown in FIG. 2.
Figure 5:
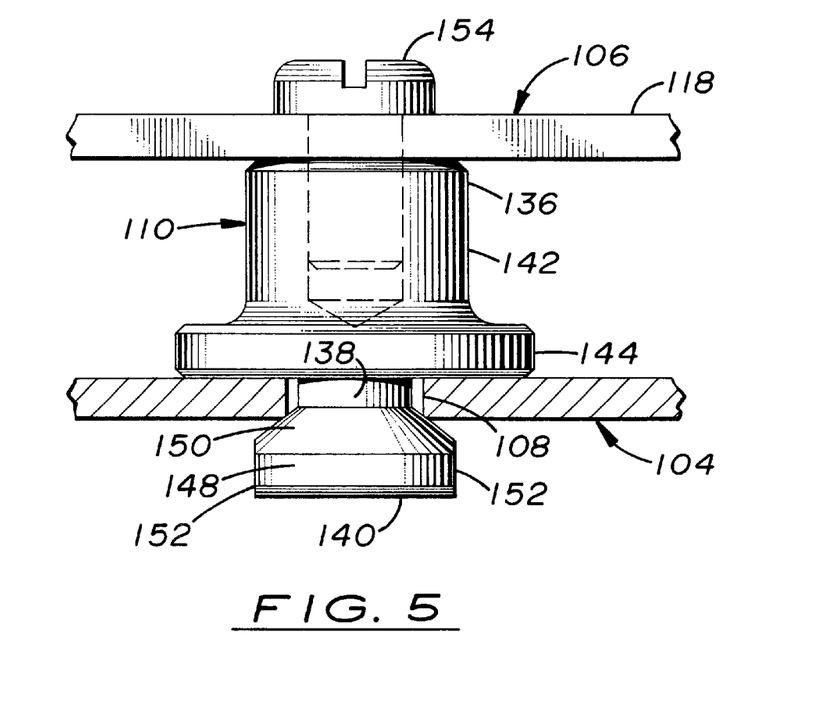
FIG. 5 is a cross-sectional view of the standoff shown in FIG. 4, illustrating engagement of the standoff within a slot of the mounting panel assembly.

Referring now to FIGS. 4 and 5, an exemplary standoff 110 is described. The standoff 110 includes a first end portion 136, a waist portion 138 adjacent to the first end portion 136, and a second end portion 140 extending outward from the waist portion 138. In one embodiment, the waist portion 138 has a width approximately equal to the thickness of the mounting panel assembly 104 and a thickness less than or equal to the width of the second end 114 of slot 108. The first and second end portions 136 & 140 have thicknesses greater than the thickness of the waist portion 138. As shown in FIGS. 4 and 5, the first end portion 136 may be comprised of a barrel member 142 terminating in a enlarged flange member 144. Preferably, the flange member 144 has a diameter greater than the diameter of the waist portion 138 to form a substantially flattened surface 146 adjacent to the waist portion 138. The second end portion 140 may likewise include an enlarged bottom member 148 having a diameter greater than the diameter of the waist portion 136 but less than the diameter of the flange member 144. A taper 150 is provided in the second end portion 140 between the waist portion 138 and the bottom member 148 thereby narrowing the diameter of the bottom member 148 to the diameter of the waist portion 138. The bottom member 148 may be shaped to further include generally opposing flattened surfaces 152 for decreasing the thickness of the second end portion 140 to facilitate insertion and removal of the standoff 110 within a slot of mounting panel assembly 104.

In exemplary embodiments of the invention, the standoffs 110 are formed of a suitable metal, e.g., steel, brass, copper, aluminum, or the like, and may be plated. Further, as shown in FIG. 5, each standoff 110 may be attached to the motherboard 106 via a fastener 154 such as a screw, bolt or the like extending through a mounting hole 120 of the motherboard 106 into a threaded hole formed in the barrel member 142. Flattened surfaces 152 may provide a means of gripping the standoff as fastener 154 is inserted so that the standoff 110 may be attached to the motherboard 106. Use of a fastener 154 to mount the standoff 110 to the motherboard 106, utilizes pre-existing holes 120 in the motherboard 106, provides a robust attachment, and furnishes good electromagnetic interference (EMI) grounding of the motherboard 106 to the chassis 102. It will be appreciated, however, that the standoffs 110 may alternately be made of non-metallic materials such as plastic, rubber, composite, or the like as contemplated by those of ordinary skill in the art. Further, other attachment means, such as adhesives, soldering, or the like, may be used for attaching the standoffs 110 to the motherboard 106. Use of such standoff materials and/or attachment means would not depart from the scope and spirit of the present invention.

Figure 6:
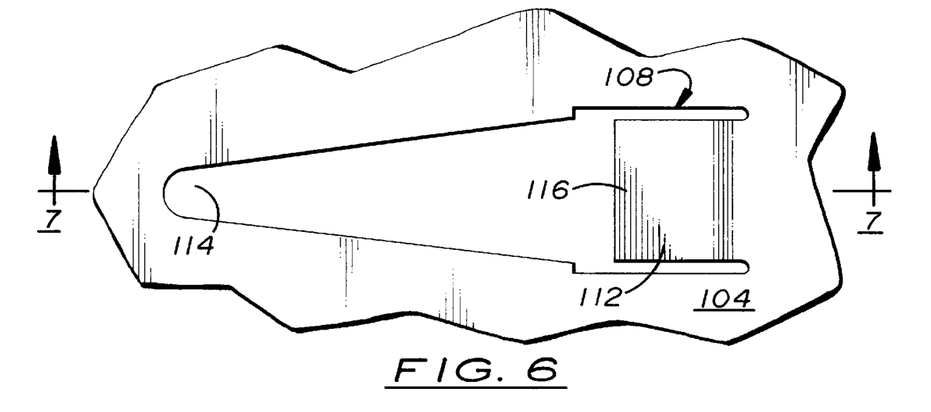
FIG. 6 is a top plan view illustrating a slot in the mounting panel assembly of the chassis shown in FIG. 1.
Figure 7:
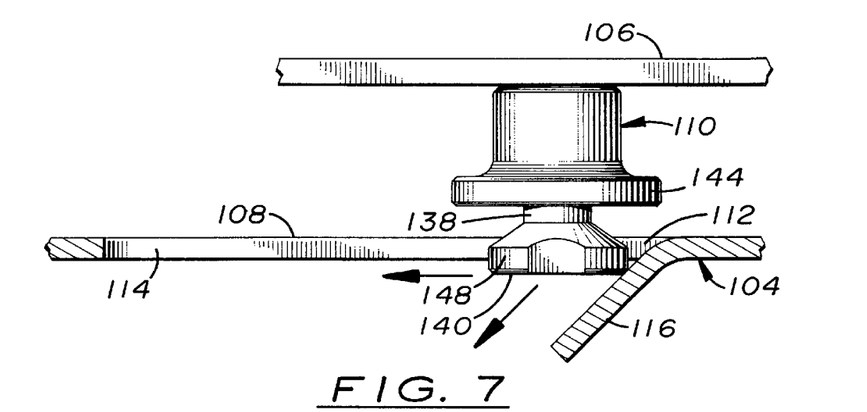
FIGS. 7 and 8 are partial cross-sectional side elevational views illustrating insertion and removal of the standoff in the slot.
Figure 8:
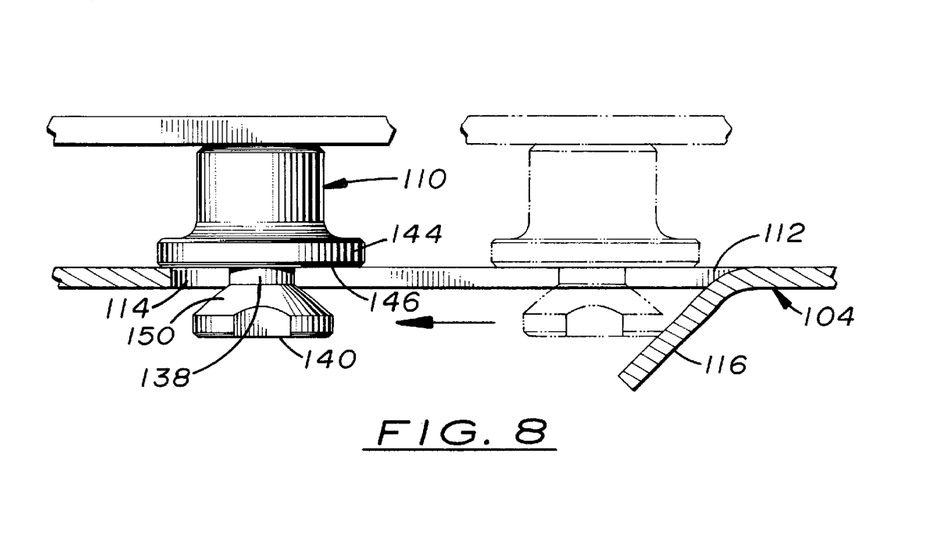

Turning now to FIGS. 6, 7 and 8, an exemplary aperture or slot 108 of the mounting panel assembly 104 is described. The slot 108 is comprised of a generally triangular shaped opening formed in the chassis 102 that includes a widened first end 112 tapering to a narrowed second end 114. Preferably, the first end 112 of the slot 108 has a width greater than that of the bottom member 148 but less than the flange member 144 of its corresponding standoff 110, thereby allowing insertion and removal of the second end portion 140 and waist portion 138 through the slot 108. Similarly, the second end 114 of the slot 108 has a width approximately at least equal to the diameter of the waist portion 138 of its corresponding standoff 110 but less than the diameters of the standoff's flange member 144 and bottom member 148.

A ramp member 116 comprised of an appendage angling downward from the mounting panel assembly 104 provides a ramp surface adjacent to the first end 112. When the standoff 110 is inserted in the slot 108 through the first end 112, the ramp member 116 is contacted by the bottom member 148 of the standoff, urging the standoff 110 toward the second end 114. Similarly, as the standoff is moved from the second end 114 to the first end 112, the ramp member 116 urges the standoff 110 out of the slot 108. In an exemplary embodiment, wherein the mounting panel assembly 104 is formed of a metal such as steel, aluminum or the like, each slot 108 may be stamped from the mounting panel assembly 104 using known stamping techniques. The ramp member 116 may then be formed by leaving the section of the area stamped from the mounting panel assembly 104 adjacent to the first end 112 attached. This section is then folded away from the mounting panel assembly 104 so that it forms an angle with the surface of the mounting panel assembly 104. Alternately, the ramp member 116 may be formed as a separate part or insert attached to the mounting panel assembly 104 beneath the slot 108.

Referring now to FIGS. 1, 2, 7 and 8, installation and removal of the motherboard within the chassis in accordance with and exemplary embodiment of the present invention is described. Preferably, standoffs 110 are attached to holes 120 formed in the motherboard 106 before installation of the motherboard 106 in the chassis 102. For instance, standoffs 110 may be mounted to the motherboard 106 by the motherboard vender prior to shipment of the motherboard 106 to the computer system manufacturer. Alternately, standoffs 110 may be mounted to the motherboard 106 by the computer system manufacturer during assembly of the computer system 100.

The motherboard 106 is positioned over mounting panel assembly 104 so that standoffs 110 are aligned with the first ends 112 of corresponding slots 108. The motherboard 106 is then pressed against the mounting panel assembly 104 so that the bottom member 148 of the second end portion 140 of each standoff 110 extends through the first end 112 of each slot 108 and surface 146 of flange member 144 is positioned adjacent to the outer surface of the mounting panel assembly 104.

As shown in FIGS. 7 and 8, as the bottom member 148 of each standoff 110 is inserted into the first end 112 of a corresponding slot 108, the bottom member 148 contacts the ramp member 116, which urges the standoff 110 toward the second end 114 of the slot 108. As the standoffs 110 are moved toward the second end 114 their respective slots 108, their taper 150 engages the edges of the slot 108. As the thickness of the slot 108 decreases, the edges of the slot 108 ride up the taper toward the waist portion 138, pulling surface 146 of flange member 144 against the surface of mounting panel assembly 104 thereby securing the motherboard 106 to the mounting panel assembly 104. In exemplary embodiments, the dimensions of each slot 108 and standoff 110 are selected so that when the standoff 110 is moved to the second end 114 of the slot 108, the standoff 110 if fully engaged within the slot 108. In this manner, the present invention prevents movement or play between the motherboard 106 and mounting panel assembly 104 which could loosen or damage components mounted to the motherboard 106 while providing a good EMI grounding. A single fastener 134 such as a thumbscrew, holding cam, or the like may then be used to secure the motherboard 106 within the chassis 102 as described in the discussion of FIGS. 1 and 2. It will be appreciated, however, that although one fastener 134, or alternately, holding device, is generally sufficient to secure the motherboard 106 to the mounting panel assembly 104, two or more fasteners or holding devices may be utilized without departing from the scope and spirit of the present invention.

To remove the motherboard 106 from the chassis 102, the chassis' access panel or cover and all interior hardware that would interfere with installation of the motherboard 106 (not shown) are first removed. Fastener 134 is then removed or loosened allowing standoffs 110 to slide within their respective slots 108. The motherboard 106 is then moved laterally so that each standoff 110 slides from the second end 114 of its slot 108 to the first end 112. As the standoff 110 is moved toward the first end 112, the bottom member 148 contacts the ramp member 116, which urges the standoff 110 upwards and out of the slot 108 so that the motherboard 106 may be removed from the chassis 102.

While one exemplary standoff/slot configuration is described in the discussion of FIGS. 1 through 8, it will be appreciated that the standoff or slot of present invention should not be limited to the specific embodiment shown. Consequently, other standoff/slot configurations employing a ramp member are contemplated, and use of such configurations would not depart from the scope and spirit of the present invention. For example, referring now to FIG. 9, a standoff/slot configuration in accordance with a second exemplary embodiment of the present invention is described. The standoff 160 includes a first end portion 162 and a second end portion 164, wherein the second end portion has a thickness greater than the thickness of the first end portion 162. Like the standoffs shown in FIGS. 1 through 8, standoffs 160 are formed of a suitable metal, e.g., steel, brass, copper, aluminum, or the like, and may be plated. Further, each standoff 160 may be attached to the motherboard 106 via a fastener 154 such as a screw, bolt or the like extending through a mounting hole 120 of the motherboard 106 into a threaded hole formed in the first end portion 162 of the standoff 160, thereby providing a robust attachment and good electromagnetic interference (EMI) grounding of the motherboard 106 to the chassis.

Figure 9:
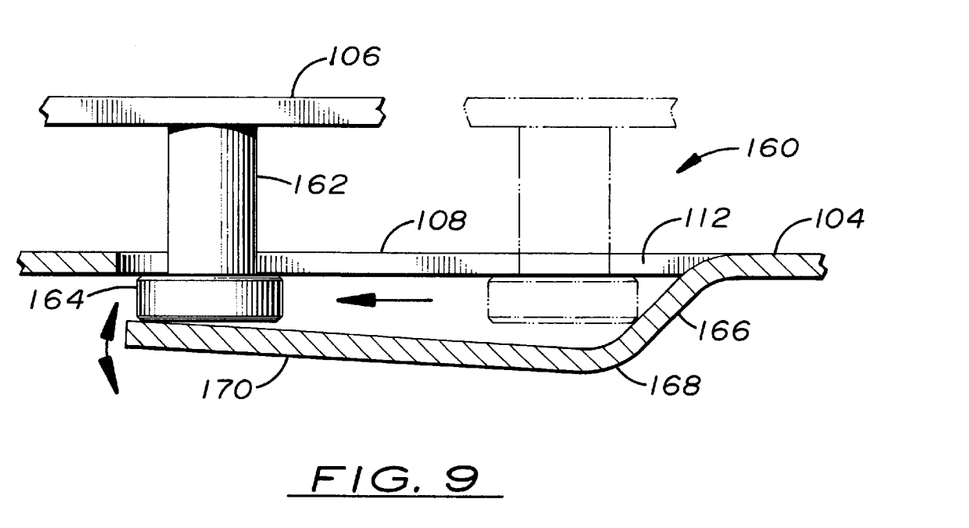
FIG. 9 is a partial cross-sectional side elevational view illustrating an alternate embodiment of the standoff and slot of the present invention.

Apertures or slots 108 are comprised of openings formed in the mounting panel assembly 104 of the chassis 102. Each such opening includes a widened first end 112 and a narrowed second end 114. Preferably, the first end 112 has a width greater than that of the second end portion 164 of its corresponding standoff 110 allowing insertion and removal of the standoff 110 through the slot 108. Each slot 108 includes an appendage 166 comprised of a ramp member 168 and a spring arm member 170. The ramp member 168 forms an angle with the surface of mounting panel assembly 104 adjacent to the first end 112 of the slot 108. When the standoff 160 is inserted in the slot 108 through the first end 112, the ramp member 168 is contacted by the second end portion 164, urging the standoff 160 toward the second end 114 of the slot 108. Likewise, when the standoff is moved from the second end 114 to the first end 112, the ramp member 168 urges the standoff 110 out of the slot 108.

As shown in FIG. 9, the spring arm member 170 extends outward from the end of the ramp member 168. As the standoff 160 moves toward the second end 114 of the slot 108, the spring arm member 170 applies a force against the bottom surface of the second end portion 164. This force clamps the second end portion 164 against the surface of mounting panel assembly 104 thereby securing the motherboard 106 to the mounting panel assembly 104.

In an exemplary embodiment, wherein the mounting panel assembly 104 is formed of a metal such as steel, aluminum or the like, the appendage 166 may be formed by stamping, leaving the stamped area attached along the first end 112. This stamped area is then folded away from the mounting panel assembly 104 to form ramp member 168 and spring arm member 170 of the appendage 166. Alternately, the appendage 166 may be formed as a separate part or insert attached to the mounting panel assembly 104 beneath the slot 108.

In FIGS. 1 though 9, computer system 100 is illustrated herein as having a "tower" or "mini-tower" style chassis 102, wherein the chassis 102 is tall, narrow, and deep instead of a "desktop" style cabinet (not shown) which is instead short, wide and deep. However, it will be appreciated that the present invention may be employed by computer systems 100 having a desktop style cabinet (not shown) by one of skill in the art without departing from the scope and spirit of the invention. It should further be recognized that the present invention is not limited to use in computer systems, but may be utilized by any electronic device utilizing a printed circuit board as described herein above. Such electronic devices may include, but are not limited to servers, photocopiers, facsimile machines, printers, televisions audio equipment, control equipment, medical equipment, and telecommunication equipment. Consequently, modification of such electronic devices to utilize the apparatus described herein by one of skill in the art would also not depart from the scope and spirit of the present invention as defined by the appended claims.

It is believed that the present invention and many of its attendant advantages will be understood by the forgoing description, and it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. Apparatus for mounting a circuit board within the chassis of an electronic device, comprising:
   a standoff suitable for attachment to said circuit board;
   a mounting panel assembly disposed in said chassis having a slot suitable for receiving said standoff, said slot including a first end and a second end, said first end being suitable for allowing insertion and removal of said standoff through said slot and said second end being suitable for engaging said standoff to retain said standoff in said slot for securing the circuit board to said mounting panel assembly; and
   a ramp member extending beneath said slot adjacent to said first end;
   said ramp member being suitable for urging said standoff toward said second end when said standoff is inserted in said slot through said first end.

2. The apparatus as claimed in claim 1, wherein said ramp member is further suitable for urging said standoff out of said slot as said standoff is moved from said second end to said first end so as to facilitate removal of said circuit board from said mounting panel assembly.

3. The apparatus as claimed in claim 1, wherein said standoff comprises a first end portion for attaching said standoff to the circuit board, a waist portion adjacent to said first end portion, and a second end portion extending outward from said waist portion wherein said first and second end portions being thicker than said waist portion.

4. The apparatus as claimed in claim 3, wherein said second end portion is tapered to said waist portion so as to urge said waist portion into engagement with said second end of said slot as said standoff is moved from said first end to said second end.

5. The apparatus as claimed in claim 3, wherein said first end includes a enlarged member for engaging said mounting panel assembly.

6. The apparatus as claimed in claim 1, further comprising a single fastener for securing said circuit board to the chassis.

7. The apparatus as claimed in claim 6, wherein said fastener is a thumbscrew.

8. The apparatus as claimed in claim 1, further comprising at least one fastener for securing said circuit board to the chassis.

9. The apparatus as claimed in claim 1, wherein said standoff is attached to said circuit board via a screw so that said circuit board is grounded to said chassis.

10. An electronic device, comprising:
    a circuit board;
    a standoff suitable for attachment to said circuit board;
    a chassis including a mounting panel assembly having a slot suitable for receiving said standoff, said slot including a first end and a second end, said first end being suitable for allowing insertion and removal of said standoff through said slot and said second end being suitable for engaging said standoff to retain said standoff in said slot for securing said circuit board to said mounting panel assembly; and
    a ramp member extending beneath said slot adjacent to said first end;
    said ramp member being suitable for urging said standoff toward said second end when said standoff is inserted in said slot through said first end.

11. The electronic device as claimed in claim 10, wherein said ramp member is further suitable for urging said standoff out of said slot as said standoff is moved from said second end to said first end so as to facilitate removal of said circuit board from said assembly.

12. The electronic device as claimed in claim 10, wherein said standoff comprises a first end portion for attaching said standoff to the circuit board, a waist portion adjacent to said first end portion, and a second end portion extending outward from said waist portion wherein said first and second end portions being thicker than said waist portion.

13. The electronic device as claimed in claim 12, wherein said second end portion is tapered to said waist portion so as to urge said waist portion into engagement with said second end of said slot as said standoff is moved from said first end to said second end.

14. The electronic device as claimed in claim 12, wherein said first end includes a enlarged member for engaging said mounting panel assembly.

15. The electronic device as claimed in claim 10, further comprising a single fastener for securing said circuit board to said chassis.

16. The electronic device as claimed in claim 15, wherein said fastener is a thumbscrew.

17. The electronic device as claimed in claim 10, further comprising at least one fastener for securing said circuit board to the chassis.

18. The electronic device as claimed in claim 10, wherein said standoff is attached to circuit board via a screw so that said circuit board is grounded to said chassis.

19. A chassis for an electronic device comprising:
- a mounting panel assembly disposed in said chassis having a slot suitable for receiving standoff mounted to a circuit board, said slot including a first end and a second end, said first end being suitable for allowing insertion and removal of said standoff through said slot and said second end being suitable for engaging said standoff to retain said standoff in said slot for securing the circuit board to said mounting panel assembly; and
- a ramp member extending beneath said slot adjacent to said first end;
- said ramp member being suitable for urging said standoff toward said second end when said standoff is inserted in said slot through said first end.

20. The chassis as claimed in claim 19, wherein said standoff comprises a first end portion for attaching said standoff to the circuit board, a waist portion adjacent to said first end portion, and a second end portion extending outward from said waist portion wherein said first and second end portions being thicker than said waist portion.

21. The chassis as claimed in claim 20, wherein said second end portion is tapered to said waist portion so as to urge said waist portion into engagement with said second end of said slot as said standoff is moved from said first end to said second end.

22. The chassis as claimed in claim 20, wherein said first end includes a enlarged member for engaging said mounting panel assembly.

23. The chassis as claimed in claim 19, further comprising a single fastener for securing said circuit board to said chassis.

24. The chassis as claimed in claim 23, wherein said fastener is a thumbscrew.

25. The chassis as claimed in claim 19, further comprising at least one fastener for securing said circuit board to said chassis.

26. The chassis as claimed in claim 19, wherein said standoff is attached to said circuit board via a screw so that said circuit board is grounded to said chassis.

* * * * *